(12) United States Patent
Archer et al.

(10) Patent No.: US 9,074,296 B2
(45) Date of Patent: Jul. 7, 2015

(54) MESOPOROUS $Co_3O_4$ NANOPARTICLES, ASSOCIATED METHODS AND APPLICATIONS

(75) Inventors: Lynden A. Archer, Ithaca, NY (US); Xiong Wen Lou, Singapore (SG)

(73) Assignee: CORNELL UNIVERSITY, Ithaca, NY (US)

(*) Notice: Subject to any disclaimer, the term of this patent is extended or adjusted under 35 U.S.C. 154(b) by 541 days.

(21) Appl. No.: 12/858,785

(22) Filed: Aug. 18, 2010

(65) Prior Publication Data

US 2011/0045352 A1   Feb. 24, 2011

Related U.S. Application Data

(60) Provisional application No. 61/235,892, filed on Aug. 21, 2009.

(51) Int. Cl.
*H01M 4/52* (2010.01)
*C30B 7/14* (2006.01)
*B82Y 30/00* (2011.01)
(Continued)

(52) U.S. Cl.
CPC .............. *C30B 7/14* (2013.01); *Y10T 428/2976* (2015.01); *Y10T 428/2982* (2015.01); *B82Y 30/00* (2013.01); *C30B 29/16* (2013.01); *C30B 29/605* (2013.01); *H01M 4/02* (2013.01); *H01M 4/131* (2013.01); *H01M 4/525* (2013.01);
(Continued)

(58) Field of Classification Search
CPC .......... H01M 4/52; H01M 4/525; C30B 1/00
USPC ................... 429/231.3, 223, 231.1
See application file for complete search history.

(56) References Cited

U.S. PATENT DOCUMENTS 7,235,224 B2   6/2007  Myeong et al.
7,399,459 B2   7/2008  Lee et al.
(Continued)

OTHER PUBLICATIONS

Lou et al., Thermal formation of mesoporous single-crystal Co3O4 nano-needles and their lithium storage properties, Journal Materials Chemistry, 2008, vol. 18, p. 4397-401.*
(Continued)

*Primary Examiner* — Kenneth Douyette
*Assistant Examiner* — James Lee
(74) *Attorney, Agent, or Firm* — William Greener; Alek Szecsy; Bond, Schoeneck & King, PLLC

(57) ABSTRACT

Each of: (1) a nanoparticle comprising a substantially single crystalline mesoporous $Co_3O_4$ material; (2) a battery electrode comprising a plurality of nanoparticles comprising the substantially single crystalline mesoporous $Co_3O_4$ material; (3) a battery comprising the battery electrode comprising the plurality of nanoparticles comprising the substantially single crystalline mesoporous $Co_3O_4$ material; and (4) a plurality of methods for preparing the nanoparticle comprising the substantially single crystalline mesoporous $Co_3O_4$ material, may be employed within the context of a lithium containing battery, such as a lithium ion battery. When the substantially single crystalline mesoporous $Co_3O_4$ material has a pore size of about 3 to about 8 nanometers enhanced lithium containing battery electrical performance properties are observed.

36 Claims, 5 Drawing Sheets

(51) Int. Cl.

| | | |
|---|---|---|
| *C30B 29/16* | (2006.01) | |
| *C30B 29/60* | (2006.01) | |
| *H01M 4/02* | (2006.01) | |
| *H01M 4/131* | (2010.01) | |
| *H01M 4/525* | (2010.01) | |
| *H01M 10/0525* | (2010.01) | |

(52) U.S. Cl.
CPC ..... *H01M10/0525* (2013.01); *H01M 2004/021* (2013.01); *Y02E 60/122* (2013.01); *Y02T 10/7011* (2013.01)

(56) References Cited

U.S. PATENT DOCUMENTS

| | | | |
|---|---|---|---|
| 7,531,149 | B2 | 5/2009 | Peng et al. |
| 7,569,847 | B2 | 8/2009 | Majumdar et al. |
| 7,585,474 | B2 | 9/2009 | Wong et al. |
| 7,608,332 | B2 | 10/2009 | Liu et al. |
| 7,736,485 | B2 | 6/2010 | Maddan |
| 2006/0121346 | A1 | 6/2006 | Nam et al. |
| 2008/0279744 | A1 | 11/2008 | Robinson |
| 2008/0299392 | A1 | 12/2008 | Liu et al. |
| 2009/0142522 | A1 | 6/2009 | Alivisatos et al. |

OTHER PUBLICATIONS

Lou et al., Self Supported Formation of Needlelike Co3O4 Nanotubes and Their Application as Lithium-Ion battery Electrodes, Advanced Materials, 2008, vol. 20, pp. 258-262.*

Wang et al., hydrothermal Synthesis and Optical, magnetic, and Supercapacitance Properties of Nanoporous Cobalt Oxide Nanorods, Journal Physical Chemistry C 2009, vol. 113, p. 4357-61.*

Larcher et al., The Electrochemical Reduction of Co3O4 in a Lithium Cell , Journal of the Electrochemistry Society 2002, vol. 143(3), p. A234-41.*

Li, Yanguang, Bing Tan, and Yiying Wu. "Mesoporous Co3O4 Nanowire Arrays for Lithium Ion Batteries with High Capacity and Rate Capability." Nano Letters 8.1 (2008): 265-70.*

Dickinson, Calum, Wuzong Zhou, Robert P. Hodgkins, Shi, Zhao, and He. "Formation Mechanism of Porous Single-Crystal Cr2O3 and Co3O4 Templated by Mesoporous Silica." Chemistry of Materials 18.13 (2006): 3088-095.*

Li, Yanguang, Bing Tan, and Yiying Wu. "Freestanding Mesoporous Quasi-Single-Crystalline Co3O4 Nanowire Arrays." Journal of the American Chemical Society 128.44(2006): 14258-4259.*

Shaju, Kuthanapillil M., Feng Jiao, Aurelie Debart, and Peter G. Bruce. "Mesoporous and Nanowire Co3O4 as Negative Electrodes for Rechargeable Lithium Batteries." Physical Chemistry Chemical Physics 9.15(2007): 1837.*

Xu, Rong, and Hua Chun Zeng. "Dimensional Control of Cobalt-hydroxide-carbonate Nanorods and Their Thermal Conversion to One-Dimensional Arrays of Co3O4 Nanoparticles." The Journal of Physical Chemistry B 107.46(2003): 12643-2649.*

Supporting Information for: Li, Yanguang, Bing Tan, and Yiying Wu. "Freestanding Mesoporous Quasi-Single-Crystalline Co3O4 Nanowire Arrays." Journal of the American Chemical Society 128. 44(2006): 14258-4259.*

* cited by examiner

MESOPOROUS CO₃O₄ NANOPARTICLES, ASSOCIATED METHODS AND APPLICATIONS

RELATED APPLICATION DATA

The instant application claims priority to U.S. Provisional Application Ser. No. 61/235,892 filed on Aug. 21, 2009, the subject matter of which is incorporated herein by reference in its entirety.

GOVERNMENT SPONSORED RESEARCH

This invention was made with government support under Contract No. DMR0551185 awarded by the National Science Foundation. The government has certain rights in the invention.

BACKGROUND

1. Field of the Invention

Embodiments of the invention relate generally to nanoparticles. More particularly, embodiments of the invention relate to nanoparticles that may be used in battery electrodes.

2. Description of the Related Art

As energy conservation and environmental consciousness considerations have become more prevalent within the context of the competitive global economies, so also has been the search for materials and processes that may assist in providing energy efficient products and environmentally conscious products.

One particular type of product that clearly plays a vital role in energy conservation and environmental consciousness is a battery, and in particular a rechargeable battery. Within the context of rechargeable batteries, lithium ion batteries are particularly prominent insofar as lithium ion batteries comprise a popular power source for mobile electronic devices. In addition, lithium ion batteries are also a common electrical power source for electric vehicles and hybrid-electric vehicles.

While lithium ion batteries, as well as other batteries, are thus clearly desirable within the context of energy conservation and environmental consciousness, lithium ion batteries are nonetheless not entirely without problems. In that regard, clearly desirable are continued improvements in lithium ion battery electrical performance properties.

Various materials and process aspects of energy and environmental related technologies are know in the energy and environmental related technology arts.

For example, Myeong at al., in U.S. Pat. No. 7,235,224, teaches a method for preparing metal oxide nanoparticles that may be used in energy and environment related technologies. This particular method comprises an aqueous solution preparation method that uses supercritical or near supercritical conditions that decompose harmful byproducts when preparing the metal oxide nanoparticles.

In addition, Lou et al., in "*Self Supported Formation of Needle-like Co₃O₄ Nanotubes and Their Application as Lithium-Ion Battery Electrodes*," Adv. Materials, 2008, 20, 258-62, teaches a solution oxidation method for effecting a topotactic transformation when forming a Co₃O₄ nanotube that may be used within a lithium ion battery electrode. The solution oxidation method uses air oxidation within an aqueous solution.

Desirable are additional methods and materials that may be used to provide improvements within energy and environmental related technologies, such as in particular providing lithium ion batteries with enhanced electrical performance properties.

SUMMARY

Embodiments of the invention include: (1) a nanoparticle comprising a substantially single crystalline mesoporous Co₃O₄ material; (2) a battery electrode comprising a plurality of nanoparticles comprising the substantially single crystalline mesoporous Co₃O₄ material; (3) a battery comprising the battery electrode that comprises the plurality of nanoparticles comprising the substantially single crystalline mesoporous Co₃O₄ material; and (4) a plurality of methods for preparing the nanoparticle comprising the substantially single crystalline mesoporous Co₃O₄ material.

When preparing the nanoparticle that comprises the substantially single crystalline mesoporous Co₃O₄ material, a particular pore size range correlates with a thermal oxidation annealing temperature within a thermal oxidation annealing method for forming the nanoparticle that comprises the substantially single crystalline mesoporous Co₃O₄ material from a corresponding nanoparticle that comprises a Co(OH)₂ material that has essentially the same nanoparticle shape and nanoparticle dimensions.

When the particular pore size range of the nanoparticle that comprises the substantially single crystalline mesoporous Co₃O₄ material is 3-8 nanometers, that corresponds with a thermal oxidation annealing temperature of about 300 degrees centigrade (or more generally a thermal oxidation annealing temperature range from about 275 to about 325 degrees centigrade), a battery, such as but not limited to a lithium ion battery, that comprises an electrode that further comprises a plurality of the nanoparticles that comprise the substantially single crystalline mesoporous Co₃O₄ material that have the pore size from about 3 to about 8 nanometers may have particularly enhanced electrical performance properties.

Within this particular disclosure, "mesoporous" is intended within the context of a substantially single crystalline Co₃O₄ material based nanoparticle to include a pore size from about 2 to about 50 nanometers, in accordance with common usage.

Within this particular disclosure, "substantially single crystalline" is intended within the context of a nanoparticle that comprises a mesoporous Co₃O₄ material to be objectively determined within the context of available measurement techniques. For example, such "substantially single crystalline" character of the nanoparticle that comprises the mesoporous Co₃O₄ material, as discussed further below, may be determined objectively incident to an analysis of a selected area electron diffraction (SAED) spectra of the nanoparticle (see, e.g., FIG. 4d, FIG. 4e and FIG. 4f).

Within the context of the selected area electron diffraction spectra of FIG. 4d, FIG. 4e and FIG. 4f, a particular nanoparticle that comprises a mesoporous Co₃O₄ material is deemed "substantially single crystalline" if the corresponding selected area electron diffraction spectra shows at minimum a 5×7 ordered array of electron diffraction spots, and preferably a 5×8 or 5×9 ordered array of electron diffraction spots. Using this particular selection criteria, both the A300 sample within FIG. 4e and the A400 sample within FIG. 4f are clearly "substantially single crystalline" while the A200 sample within FIG. 4d is clearly not "substantially single crystalline."

Within this particular disclosure, "solid core" is intended to describe a nanoparticle that has a core material that may be impervious or mesoporous, but the core material is contiguous with, derived from, and no less dense than, a surface material of the nanoparticle.

A particular nanoparticle in accordance with the invention includes a nanoparticle comprising a substantially single crystalline mesoporous $Co_3O_4$ material.

A particular battery electrode in accordance with the invention includes a battery electrode comprising a plurality of nanoparticles comprising a substantially single crystalline mesoporous $Co_3O_4$ material.

A particular battery in accordance with the invention includes a battery comprising a battery electrode comprising a plurality of nanoparticles comprising a substantially single crystalline mesoporous $Co_3O_4$ material.

A particular method for preparing a $Co_3O_4$ nanoparticle in accordance with the invention includes thermal annealing a first nanoparticle comprising a $Co(OH)_2$ material in an oxidizing atmosphere to provide a second nanoparticle comprising a substantially single crystalline mesoporous $Co_3O_4$ material.

Another particular method for preparing a $Co_3O_4$ nanoparticle in accordance with the invention includes preparing a first nanoparticle comprising a $Co(OH)_2$ material. This other particular method also includes thermal annealing the first nanoparticle in an oxidizing atmosphere to form from the first nanoparticle a second nanoparticle comprising a substantially single crystalline mesoporous $Co_3O_4$ material.

BRIEF DESCRIPTION OF THE DRAWINGS

The objects, features and advantages of the invention are understood within the context of the Detailed Description of Embodiments, as set forth below. The Detailed Description of Embodiments is understood within the context of the accompanying drawings, that form a material part of this disclosure, wherein.

DETAILED DESCRIPTION OF EMBODIMENTS OF THE INVENTION

Non-limiting exemplary embodiments of the invention, which include: (1) a nanoparticle comprising a substantially single crystalline mesoporous $Co_3O_4$ material; (2) a battery electrode comprising a plurality of nanoparticles comprising the substantially single crystalline mesoporous $Co_3O_4$ material; (3) a battery comprising the battery electrode comprising the plurality of nanoparticles comprising the substantially single crystalline mesoporous $Co_3O_4$ material; and (4) a plurality of methods for preparing the nanoparticle comprising the substantially single crystalline mesoporous $Co_3O_4$ material, will be understood as set forth below. The Detailed Description of Embodiments is understood within the context of the drawings described above. Since the drawings are intended for illustrative purposes, the drawings are not necessarily drawn to scale.

Figure 1:
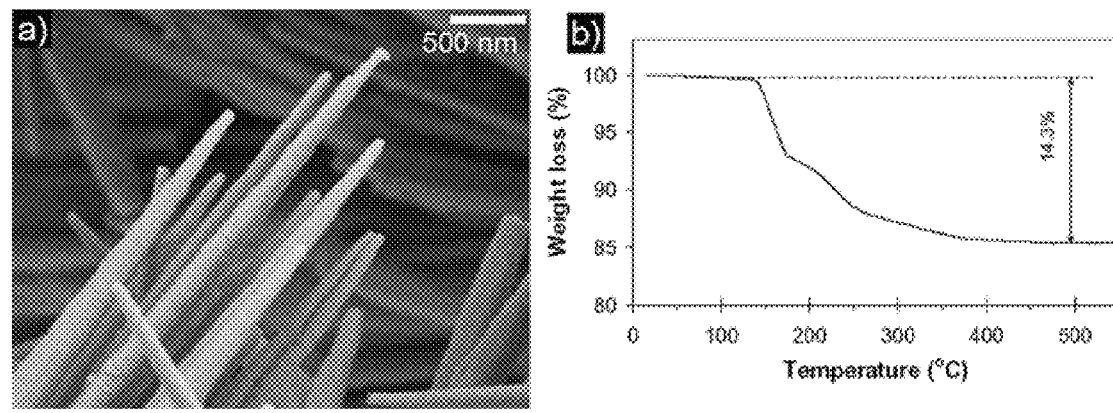
FIG. 1a shows a field emission scanning electron microscopy (FESEM) image of a plurality of precursor $Co(OH)_2$ nanoneedles that may be thermal oxidation annealed to form a plurality of product mesoporous $Co_3O_4$ nanoneedles in accordance with the invention.
FIG. 1b shows a thermogravimetric analysis (TGA) spectrum (under air with a ramp of 5 degrees centigrade per minute) for the plurality of precursor $Co(OH)_2$ nanoneedles that may be thermal oxidation annealed to form the plurality of product mesoporous $Co_3O_4$ nanoneedles in accordance with the invention.

The embodied invention broadly uses the precursor nanoparticles that comprise a $Co(OH)_2$ material as illustrated in FIG. 1a to provide, incident to thermal oxidation annealing within a particular temperature range, the product nanoparticles that comprise a substantially single crystalline mesoporous $Co_3O_4$ material as illustrated in FIG. 3b and FIG. 3c. These particular product nanoparticles that comprise the substantially single crystalline mesoporous $Co_3O_4$ material may then be fabricated into a battery electrode, such as but not limited to a negative electrode that is used in a lithium ion battery. The resulting lithium ion battery has enhanced electrical performance properties, as will be illustrated within the context of discussion of the experimental data that follows.

The selection criteria for determining the "substantially single crystalline" character of a particular mesoporous $Co_3O_4$ nanoparticle are discussed above, within the context of the definition of the terminology "substantially single crystalline."

Within the embodiments and the invention, the precursor nanoparticles that comprise the $Co(OH)_2$ material as illustrated in FIG. 1a, and the product nanoparticles that comprise the substantially single crystalline mesoporous $Co_3O_4$ material as illustrated in FIG. 3b and FIG. 3c have essentially the same dimensions (i.e., length dimensions along a long axis and width dimensions along a short axis perpendicular to the long axis are within about 10 percent variation for the precursor $Co(OH)_2$ nanoparticles and the product substantially single crystalline mesoporous $Co_3O_4$ nanoparticles). Thus, each of the precursor $Co(OH)_2$ nanoparticles and the product substantially single crystalline mesoporous $Co_3O_4$ nanoparticles has a length along a long axis from about 100 nanometers to about 10 microns and a maximum cross-sectional diameter across a short axis that is perpendicular to the long axis from about 10 nanometers to about 500 nanometers. Additionally, the product nanoparticles that comprise the substantially single crystalline mesoporous $Co_3O_4$ material as illustrated in FIG. 3b and FIG. 3c may also include a solid core.

As will be discussed in further detail within the context of experimental data below, the product nanoparticles that comprise the substantially single crystalline mesoporous $Co_3O_4$ material have a pore size from about 2 to about 20 nanometers formed incident to thermal oxidation annealing of the precursor nanoparticles that comprise the $Co(OH)_2$ material at a thermal oxidation annealing temperature from about 200 to about 400 degrees centigrade. More preferably, product nanoparticles that comprise the substantially single crystalline mesoporous $Co_3O_4$ material have a pore size from about 3 to about 8 nanometers at a thermal oxidation annealing temperature from about 275 to about 325 degrees centigrade, and most preferably about 300 degrees centigrade.

The foregoing thermal oxidation annealing is typically undertaken in an ambient air thermal oxidant at atmospheric pressure for a time period from about 4 to about 8 hours, more preferably from about 5 to about 7 hours.

Alternative thermal oxidation annealing environments are not precluded within the embodiment or within the invention. Such alternative thermal oxidation annealing environments may include, but are not necessarily limited to oxygen and ozone thermal oxidation annealing environments, at sub-atmospheric pressures, atmospheric pressures or super-atmospheric pressures.

The experimental data that follows provides a correlation between pore size of a product nanoparticle that comprises the substantially single crystalline mesoporous $Co_3O_4$ material, and battery cell performance directed towards lithium ion battery enhanced electrical performance properties. To that end, it is anticipated that product nanoparticles that comprise the substantially single crystalline mesoporous $Co_3O_4$ material within the foregoing pore size range of from about 3 to about 8 nanometers are particularly useful as an electrode material within lithium related batteries, such as but not limited to lithium ion batteries.

It is further anticipated that such utility of a product nanoparticle that comprises the substantially single crystalline mesoporous $Co_3O_4$ material with the pore size from about 2 to about 20 nanometers may be realized using any of several shapes of such a nanoparticle. To that end, such a substantially single crystalline mesoporous $Co_3O_4$ material nanoparticle having a 3 to 8 nanometer pore size using any of several shapes is thus desirable within the context of enhanced electrical performance properties of lithium related batteries, such as but not limited to lithium ion batteries.

The nanoparticles that comprise the substantially single crystalline $Co_3O_4$ material in accordance with the embodiments and the invention may be fabricated into a battery electrode using methods and materials that are otherwise generally conventional in the battery electrode fabrication art. Typically and preferably, such a battery electrode will comprise: (1) from about 70 to about 90 percent by weight of the nanoparticles that comprise the substantially single crystalline $Co_3O_4$ material; along with (2) about 5 to about 15 percent by weight conductivity enhancing agent such as but not limited to carbon black; and (3) about 5 to about 15 percent by weight binder material such as but not limited to polyvinylidene difluoride (PVDF). The battery electrode may be fabricated using calendaring, milling, extrusion and related processing methods that are otherwise generally conventional.

Figure 6:
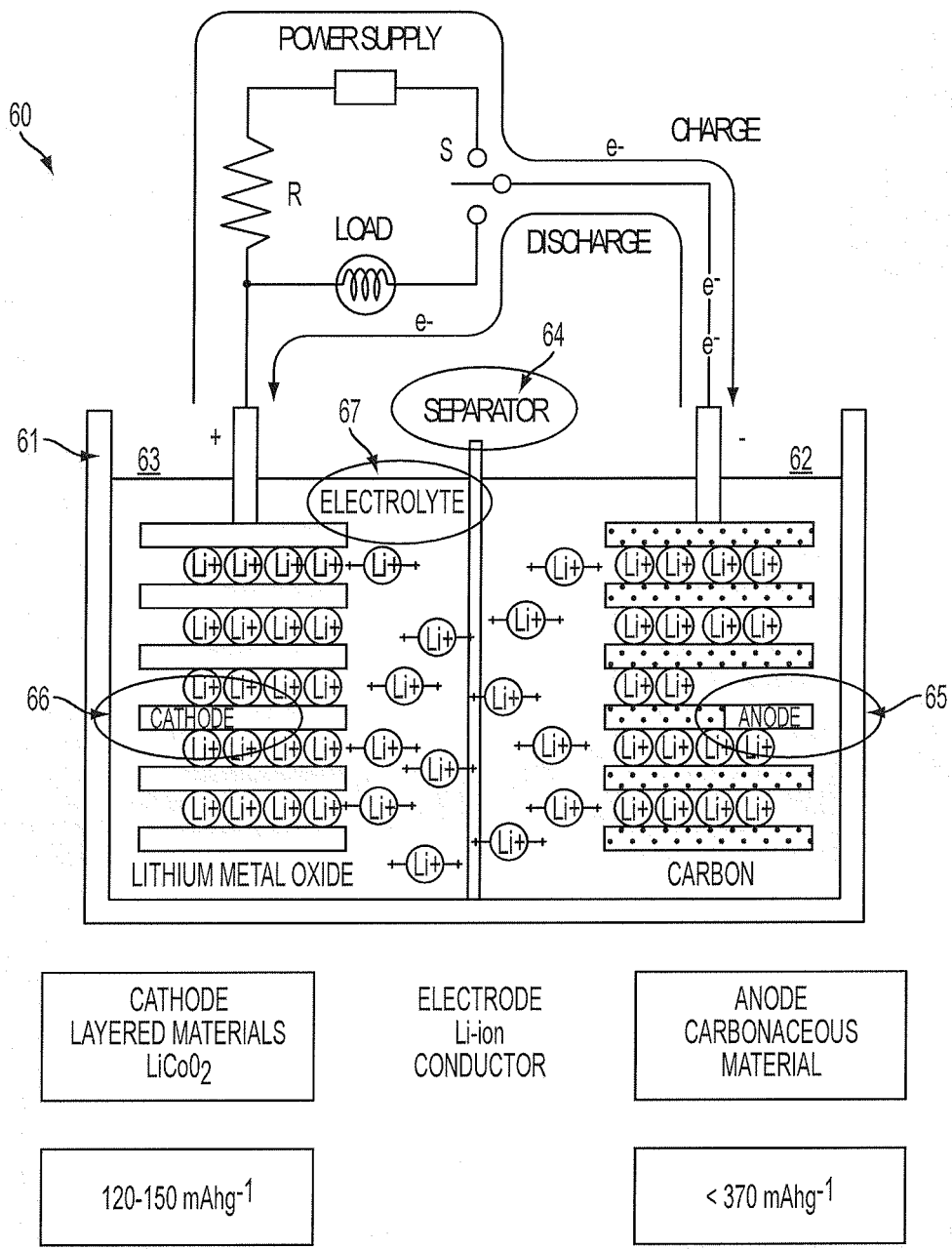
FIG. 6 shows a schematic diagram of a lithium ion battery within which may be assembled and used an electrode that comprises the product mesoporous $Co_3O_4$ nanoneedles prepared incident to thermal oxidation annealing of the precursor $Co(OH)_2$ nanoneedles at the three different temperatures of 200 C, 300 C and 400 C.

The battery electrode may be fabricated and assembled into a battery, and in particular into a lithium ion battery, as is also otherwise generally conventional in the art. Such a generally conventional lithium ion battery 60 is illustrated in FIG. 6, and described in further detail below.

EXPERIMENTAL

Materials Preparation

In a typical synthesis, 50 mL of deionized water was mixed with 50 mL of ammonia solution (28-30%, or 29.6%) in a 500 mL three-necked flask with a reflux condenser mounted on top, which was then immersed into an oil bath at about 95-100 C. After heating for about 10 min under constant magnetic stifling (380 rpm), 20 mL of 1.0 M $Co(NO_3)_2.6H_2O$ was added dropwise within about 2 min while using a burette. The reaction was continued for about 1 h (timing started when adding cobalt nitrate) before the flask was taken out of the oil bath and cooled down naturally.

The solid product was harvested by centrifugation and washed with deionized water several times before drying at 50 C in an oven overnight. Afterwards the pink powder was calcined in air at 200-400 C for 6 h with a temperature ramp of 1 C per minute.

Materials Characterization

Products were thoroughly characterized with x-ray powder diffraction (XRD; Scintag PAD X, Cu Kα, λ=1.5406 Å°), field emission scanning electron microscopy (FESEM; Hitachi S4500), transmission electron microscopy and selected area electron diffraction (TEM/SAED; JEOL-1200EX, 120 kV), ultrahigh-vacuum scanning transmission electron microscopy (UHV-STEM; VG-HB501UX, 100 kV) equipped with energy dispersive x-ray spectroscopy (EDS), and high-resolution transmission electron microscopy (HR-TEM; FEI Tecnai G20, 200 kV).

Electrochemical Measurements

The electrochemical measurements were carried out using two electrode cells with lithium metal as the counter and reference electrodes at room temperature. The working electrode consisted of 80 wt % active material ($Co_3O_4$), 10 wt % conductivity agent (carbon black, Super-P), and 10 wt % binder (polyvinylidene difluoride, PVDF, Aldrich). The electrolyte was 1 M $LiPF_6$ in a 50:50 w/w mixture of ethylene carbonate and diethyl carbonate. Cell assembly was carried out in a glove box with the concentrations of moisture and oxygen below 1 ppm. Charge-discharge cycles of $Co_3O_4$/Li half-cells were measured between 0.01 and 3.0 V at a constant current density of 150 mA/g with Maccor-Series-2000 and Maccor 4304 battery testers.

Results and Discussion

The preparation and synthesis involved two steps, formation of β-$Co(OH)_2$ nanoneedles in solution, and subsequent thermal conversion of the β-$Co(OH)_2$ nanoneedles to substantially single crystalline mesoporous $Co_3O_4$ material nanoneedles under controlled thermal oxidation annealing conditions.

FIG. 1a illustrates the precursor $\beta$-$Co(OH)_2$ nanoneedles that have a tapered needle shape, which have previously been characterized in accordance with Lou et al., within the Description of the Related Art, to be single-crystalline grown in the [001] direction. From Lou, within the foregoing Description of the Related Art, it is anticipated that cobalt hydroxide is thermally unstable, and it will decompose at a temperature below 200 C and simultaneously convert into a stable spinel $Co_3O_4$ in air.

From the thermal gravimetric analysis (TGA) data of FIG. 1b, the thermal decomposition behavior of the $\beta$-$Co(OH)_2$ nanoneedles was generally in good agreement with such anticipated decomposition. However, the as prepared $\beta$-$Co(OH)_2$ nanoneedles are more prone to decomposition, which starts at about 140 C, possibly due to unique structure and small size.

As is illustrated within FIG. 1b, there was an abrupt change of slope for the weight loss at around 179 C, presumably indicating the onset of oxidation. Such presumed oxidative decomposition was nearly complete at around 400 C, corresponding to a total weight loss of about 14.3%. This total weight loss is slightly higher than the theoretical value (13.6%) for thermal oxidative decomposition of cobalt hydroxide to form cobalt oxide (i.e., $Co(OH)_2 \rightarrow Co_3O_4$), which may be due to evaporation of adsorbed water (hydrate) and/or possible incomplete oxidation.

Based on the TGA data of FIG. 1b, three samples were prepared by annealing the precursor $\beta$-$Co(OH)_2$ nanoneedles in air at 200 C, 300 C or 400 C. These three samples are hereinafter designated as sample A200, sample A300, and sample A400, respectively.

Figure 2:
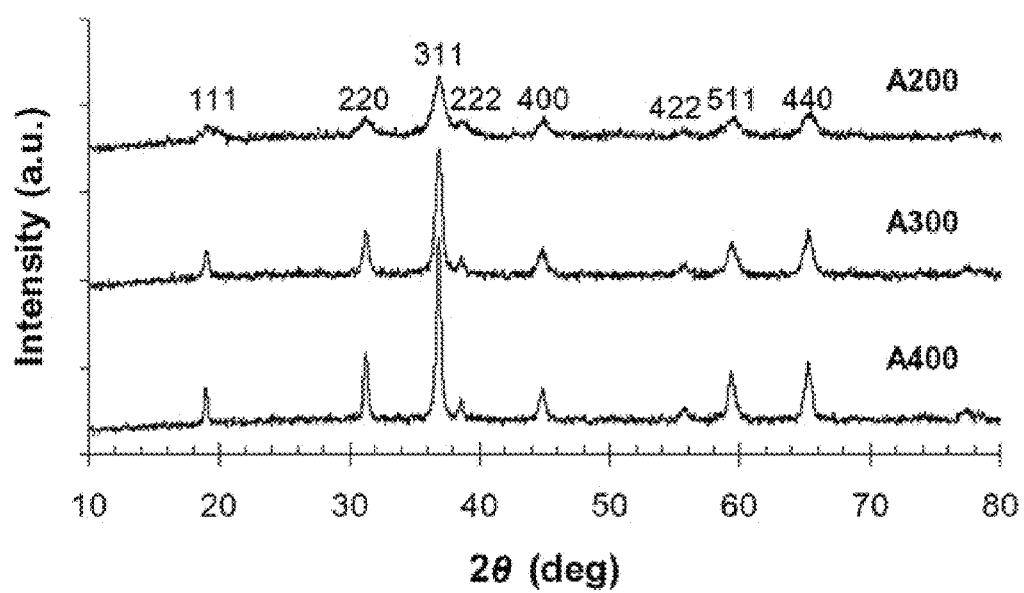
FIG. 2 shows a plurality of x-ray diffraction (XRD) spectra for thermal oxidation annealing of the plurality of precursor $Co(OH)_2$ nanoneedles to form the plurality of product mesoporous $Co_3O_4$ nanoneedles at three different temperatures of 200 C, 300 C and 400 C.

The crystallographic structure of the product $Co_3O_4$ black powder after thermal oxidation annealing treatment was analyzed by x-ray powder diffraction (XRD) as shown in FIG. 2. Results show that all three samples had identical peaks, which can be perfectly indexed to cubic spinel $Co_3O_4$ (JCPDS card no. 42-1467, space group: Fd3m, $a_o$=8.084 Å). As expected, with increasing thermal oxidation annealing temperature, the crystallinity improved significantly, as suggested by the increased peak intensity. The mean crystallite sizes were estimated to be 4.0, 13.4, and 27.3 nm for the A200, A300, and A400 samples respectively, using the Scherrer's formula based on the (311) peak.

Figure 3:
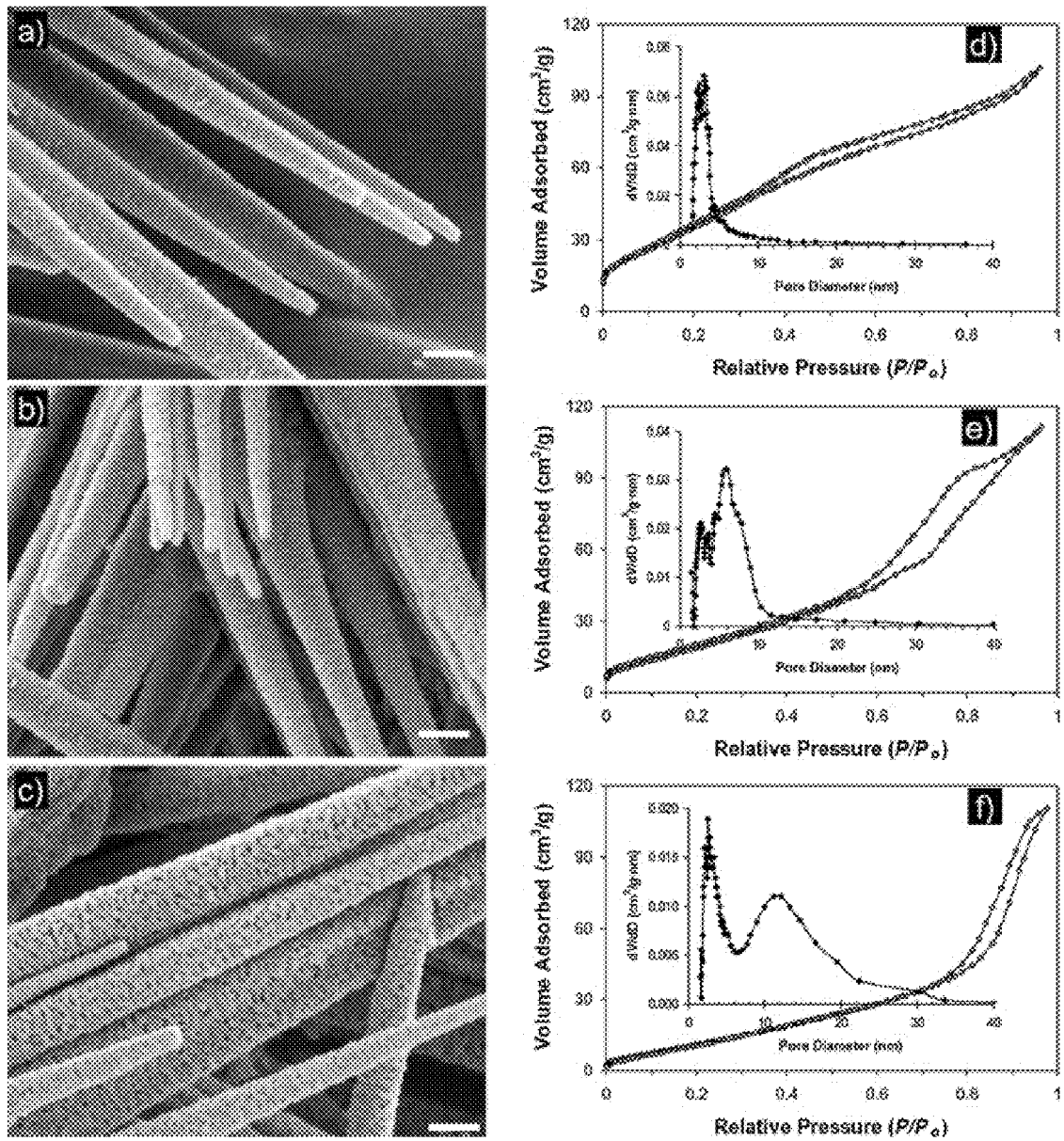
FIGS. 3a, 3b and 3c show a series of field emission scanning electron microscopy (FESEM) images (scale bars represent 250 nanometers) of the product mesoporous $Co_3O_4$ nanoneedles prepared incident to thermal oxidation annealing of the precursor $Co(OH)_2$ nanoneedles at the three different temperatures of 200 C, 300 C and 400 C.
FIGS. 3d, 3e and 3f show a corresponding series of nitrogen adsorption-desorption isotherms (at 77 degrees Kelvin) and pore size distributions graphs for the product mesoporous $Co_3O_4$ nanoneedles prepared incident to thermal oxidation annealing of the precursor $Co(OH)_2$ nanoneedles at the three different temperatures of 200 C, 300 C and 400 C.

The textural properties of the A200, A300 and A400 samples were characterized by field emission scanning electron microscopy (FESEM) and nitrogen sorption and desorption, as shown in FIG. 3. From the FESEM images, the needle-like shape morphology of the precursor $\beta$-$Co(OH)_2$ nanoneedles is completely unaltered during the thermal oxidation annealing conversion. The porous structure becomes more apparent with increasing thermal oxidation annealing temperature, as for the A400 sample that is illustrated in FIG. 3c, which porous structure can be quantified with nitrogen adsorption/desorption measurements.

The characteristic type IV isotherms with type H3 hysteresis loops confirmed the highly mesoporous structure of the product mesoporous $Co_3O_4$ nanoneedles prepared. With increasing thermal oxidation annealing temperature, the hysteresis loop shifted to higher relative pressure, indicating larger mesopores. This result is consistent with above FESEM observation. More quantitative measures come from the corresponding pore size distributions calculated from the adsorption branches.

As can be seen from FIG. 3d, the pore size distribution was very narrow in the range from about 2 to about 4 nm for the A200 sample. Such small pores may be generated from local decomposition-oxidation. Because of the relatively low annealing temperature of 200 C, thermal oxidation annealing re-crystallization appeared insignificant as confirmed by earlier XRD analysis of FIG. 2. With a higher thermal oxidation annealing temperature of 300 C, crystallites grew larger via thermal re-crystallization. As a result, the inter-crystallite pores became larger with broader pore size distribution in the range from about 3 to about 8 nm, as illustrated in the FIG. 3e insert. With further increase in thermal oxidation annealing temperature to 400 C, a bimodal nature of the pore size distribution for the A400 sample became apparent as illustrated in the FIG. 3f insert, namely, about 2 to about 6 nm, and about 8 to about 18 nm.

It was expected that such mesoporous structures of the A200, A300 and A400 samples would give high Brunauer-Emmett-Teller (BET) specific surface areas. Such specific surface areas were found to be 152.1, 84.9 and 55.4 m2/g for the A200, A300, and A400 samples, respectively. On the contrary, the change in total pore volume was less substantial (0.157, 0.172, 0.170 cm3/g for the A200, A300 and A400 samples). This can be understood by recognizing that such mesoporosity may be created by volume contraction during the crystal reconstruction. More specifically, it can alternatively be easily calculated that the number density of Co atoms in $Co_3O_4$ is much higher than in the precursor $\beta$-$Co(OH)_2$ (i.e., 45.4 vs. 24.5 $nm^{-3}$).

The microstructure of the A200, A300 and A400 samples was further examined by transmission electron microscopy (TEM) and selected area electron diffraction (SAED). As can be seen clearly from the TEM images shown in FIG. 4a, the nanoneedles of A200 sample appeared constructed from numerous nanocrystals with small inter-crystallite pores, while the SAED pattern of FIG. 4d suggested some limited degree of orientation.

Figure 4:
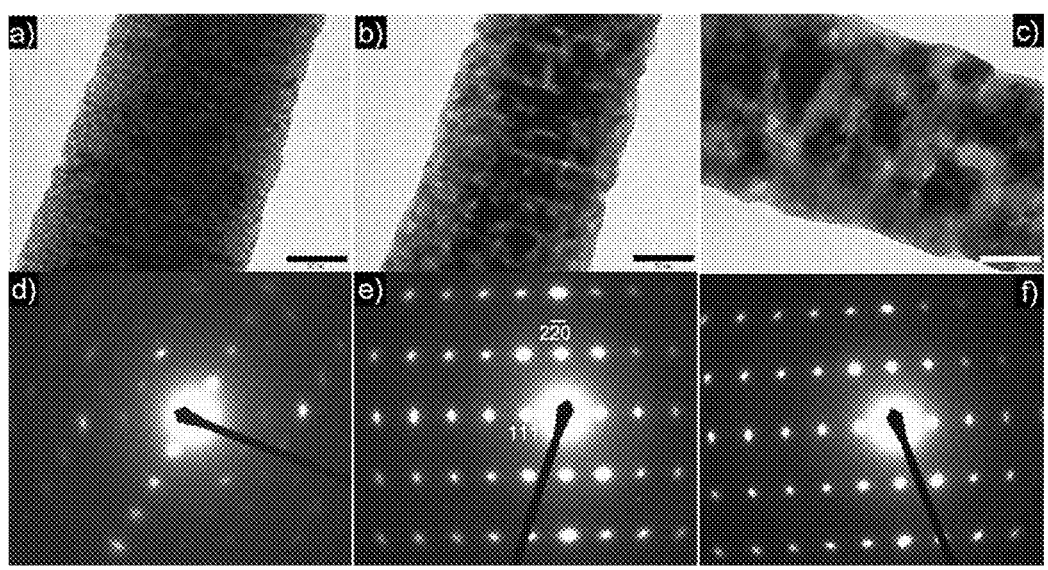
FIGS. 4a, 4b and 4c show a series of transmission electron microscopy (TEM) images (scale bars represent 50 nanometers) for the product mesoporous $Co_3O_4$ nanoneedles prepared incident to thermal oxidation annealing of the precursor $Co(OH)_2$ nanoneedles at the three different temperatures of 200 C, 300 C and 400 C.
FIGS. 4d, 4e and 4f show a series of selected area electron diffraction (SAED) images for the product mesoporous $Co_3O_4$ nanoneedles prepared incident to thermal oxidation annealing of the precursor $Co(OH)_2$ nanoneedles at the three different temperatures of 200 C, 300 C and 400 C.

With pronounced thermal re-crystallization of the A300 and A400 samples, the small nanocrystals grew in an oriented manner to form an integrated porous architecture with interconnected large pores as shown in FIG. 4b and FIG. 4c.

SAED analyses based on many individual nanoneedles revealed that the porous $Co_3O_4$ nanoneedles for the A300 and A400 samples are nearly (i.e., substantially) single crystalline with an axis identified in [111] direction. Two typical such SAED patterns are given in FIG. 4e and FIG. 4f. [111] zone patterns (hexagonal) were also occasionally observed. Hence, it is possible to have a small number of nanocrystals in a single thermal oxidation annealed nanoneedle oriented in other directions. Thus obtained mesoporous structures with 3D single-crystal framework in accordance with the embodiment might be more robust compared to amorphous or polycrystalline structures obtained from conventional templating routes, in which partial collapse of the porous structure upon template removal or thermal annealing may be inevitable.

As is noted above within the context of the definition of "substantially single crystalline" for a mesoporous $Co_3O_4$ nanoparticle, the A200 sample did not fulfill the defined conditions of "substantially single crystalline" since the selected area electron diffraction image for the A200 sample did not present a 5×7, 5×8 or 5×9 array of electron diffraction spots. In contrast, since the A300 sample and the A400 sample each presented a selected area electron diffraction image with at least a 5×7 array of electron diffraction spots, each of the A300 sample and the A400 sample was deemed "substantially single crystalline" within the context of the foregoing definition.

To test the hypothesis that electrodes with robust porous nanostructures are advantageous for lithium ion batteries, the lithium storage properties of as prepared A200, A300 and A400 sample mesoporous $Co_3O_4$ nanoneedles were investigated using the standard $Co_3O_4$/Li half-cell configuration, where $Co_3O_4$ and lithium foil served as positive and negative electrodes respectively.

Figure 5:
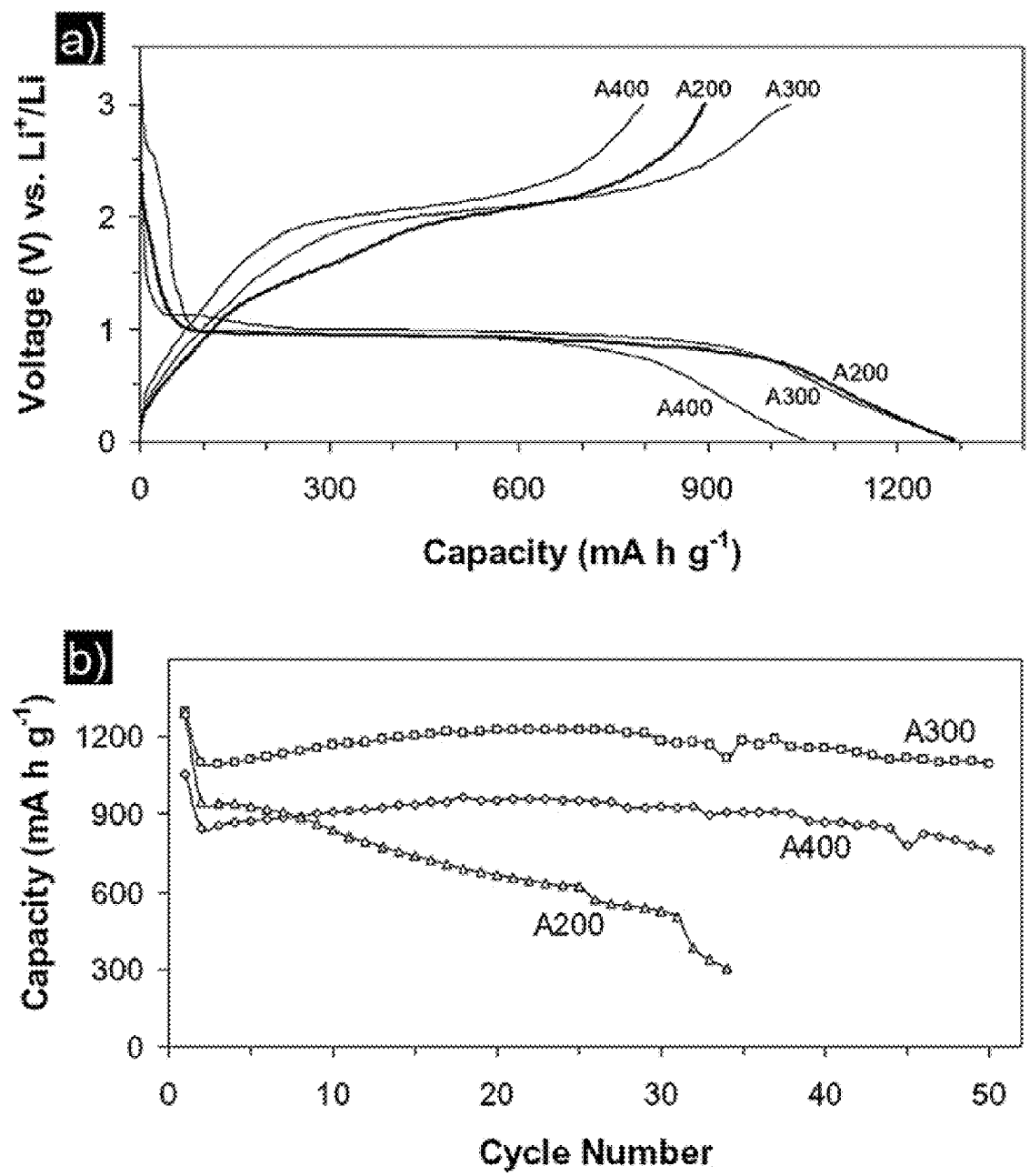
FIG. 5a shows a series of first cycle discharge carrier curves for a lithium metal cell that includes an electrode fabricated using the product mesoporous $Co_3O_4$ nanoneedles prepared incident to thermal oxidation annealing of the precursor $Co(OH)_2$ nanoneedles at the three different temperatures of 200 C, 300 C and 400 C.
FIG. 5b shows a series of discharge capacity curves for a lithium metal cell that includes an electrode fabricated using the product mesoporous $Co_3O_4$ nanoneedles prepared incident to thermal oxidation annealing of the precursor $Co(OH)_2$ nanoneedles at the three different temperatures of 200 C, 300 C and 400 C.

FIG. 5a shows 1st cycle discharge-charge voltage profiles for all three samples. The profiles are qualitatively very similar indicating the same electrochemical pathway. The long characteristic plateau around 1.0 V observed in the first discharge curves of FIG. 5a is associated with the conversion reaction $Co_3O_4 + 8Li+ + 8e- \rightarrow 4Li_2O + 3Co$, which has a theoretical capacity of 890 mA h/g. The following sloping region might be attributed to the formation of a surface polymeric layer, which in general contributes to additional capacity. For the A200 and A300 samples, the first discharge capacity was about 1290 mA h/g, with a contribution of about 900 mA h/g from the plateau region (corresponding to the insertion of about 8 Li per formula unit). For the A400 sample, the first discharge capacity was only about 1055 mA h/g.

As can be seen, this lower capacity was mainly due to the reduced Li insertion from the plateau region, which might be caused by the crystallite size effect. From the fully discharged state, 69.4% (894 mA h/g, A200), 79.4% (1030 mA h/g, A300), 75.5% (797/mA h/g, A400) of the stored lithium can be extracted upon charging to 3 V. Importantly, the A300 sample had an irreversible loss of only 20.6%, which may be the lowest such irreversible loss for nanostructured $Co_3O_4$ materials. More importantly, this capacity difference may become insignificant in the course of the first several cycles, such that a coulombic efficiency may reach nearly 100%.

FIG. 5b illustrates the lithium ion battery performance data in terms of cycling performance, that is, lithium storage capacity retention versus cycle number, at a current density of 150 mA/g (equivalent to 1 Li per formula unit in 0.7 h, or 1.43 C).

As is illustrated in FIG. 5b, it is apparent that the A200 sample had the most inferior cycling performance since the capacity faded gradually even during the first 30 cycles, and even more rapidly after the first 30 cycles. This inferior performance might be attributed to the low crystallinity of the A200 sample. Possibly due to their improved crystallinity, both A300 and A400 samples had excellent cycling performance.

Also observed was a gradual increase of the reversible capacity to an ultrahigh value of about 1200 mA h/g over first 26 cycles for the A300 sample. This feature may be associated with the unique textural characteristics of the A300 sample. The reversible capacity after 50 cycles was observed to be 1079 mA h/g for the optimized A300 sample, which is about 3 times that of current carbon-based electrode materials. This improved cycling performance might be attributed to the robust mesoporous structure of the A300 sample.

Based upon the above results, it is evident that A300 sample was superior among the three samples with the highest lithium storage capacity, lowest irreversible loss, and excellent cycling performance. In view of their excellent lithium storage properties and simplicity in synthesis, the inventive substantially single crystal mesoporous $Co_3O_4$ material nanoneedles may be of interest for advanced lithium ion batteries.

For reference purposes, FIG. 6 shows a schematic diagram of a lithium ion battery within which may be assembled and used an electrode comprising a plurality of substantially single crystalline mesoporous $Co_3O_4$ material nanoparticles in accordance with the invention. The lithium ion battery 60 includes a housing 61 that is separated into an anode compartment 62 that contains an anode 65 and a cathode compartment 63 that contains a cathode 66. The anode compartment 62 and the cathode compartment 63 are separated by a separator 64. Included within the anode compartment 62 and the cathode compartment 63 is an electrolyte 67.

Within a discharge mode that is effected by switching a switch S to a load, the lithium ion battery produces electrons at the negative electrode anode 65 that pass through the load to the positive electrode cathode 66. Simultaneously, lithium ions within the electrolyte 67 pass through the separator 64 to the positive electrode cathode 66.

In a recharge mode that is effected by switching the switch S to a power supply in series with a resistor R, electrons are injected into the negative electrode anode 65 from the power supply and lithium ions return from the positive electrode cathode 66 through the separator 64 to the negative electrode anode 65.

Within the instant embodiments and the invention, the carbon negative electrode anode 65 may be replaced by an electrode that comprises the mesoporous substantially single crystalline $Co_3O_4$ material nanoparticles in accordance with the instant embodiments and the invention.

The preferred embodiments and experimental data in accordance with the invention are illustrative of the invention rather than limiting of the invention. Revisions and modifications may be made to methods, materials, structures and dimensions of a nanoparticle, a battery electrode that comprises a plurality of nanoparticles, a battery that comprises the battery electrode and methods for preparing the nanoparticle in accordance with the preferred embodiments, while still providing a nanoparticle, a battery electrode that comprises a plurality of nanoparticles, a battery that comprises the battery electrode and a plurality of methods for preparing the nanoparticle in accordance with the invention, further in accordance with the accompanying claims.

What is claimed is:

1. A solid core nanoparticle comprising a substantially single crystalline mesoporous $Co_3O_4$ material characterized by at least a 5×7 array of selected area electron diffraction spots.

2. The nanoparticle of claim 1 wherein the nanoparticle has a needle shape, where the needle shape has a length from about 2 to about 10 microns and a width from about 10 to about 500 nanometers.

3. The nanoparticle of claim 1 wherein the substantially single crystalline mesoporous $Co_3O_4$ material has a pore size from about 2 to about 20 nanometers.

4. The nanoparticle of claim 1 wherein the substantially single crystalline mesoporous $Co_3O_4$ material has a pore size from about 3 to about 8 nanometers.

5. The nanoparticle of claim 1 wherein the substantially single crystalline mesoporous $Co_3O_4$ material has a bimodal pore size distribution from about 2 to about 6 nanometers and from about 8 to about 18 nanometers.

6. The nanoparticle of claim 1 wherein a substantially single crystalline character of the substantially single crystalline mesoporous $Co_3O_4$ material is measured as a selected area electron diffraction spectrum of the substantially single crystalline mesoporous $Co_3O_4$ material having at least a 5×8 array of electron diffraction spots.

7. The nanoparticle of claim 1 wherein a plurality of the nanoparticles comprises a powder.

8. A battery electrode comprising a plurality of solid core nanoparticles comprising a substantially single crystalline mesoporous $Co_3O_4$ material characterized by at least a 5×7 array of selected area electron diffraction spots.

9. The battery electrode of claim 8 wherein the plurality of nanoparticles has a needle shape, the needle shape having a length from about 2 to about 10 microns and a width from about 10 to about 500 nanometers.

10. The battery electrode of claim 8 wherein the substantially single crystalline mesoporous $Co_3O_4$ material has a pore size from about 2 to about 20 nanometers.

11. The battery electrode of claim 8 wherein the substantially single crystalline mesoporous $Co_3O_4$ material has a pore size from about 3 to about 8 nanometers.

12. The battery electrode of claim 8 wherein the substantially single crystalline mesoporous $Co_3O_4$ material has a bimodal pore size distribution from about 2 to about 6 nanometers and from about 8 to about 18 nanometers.

13. The battery electrode of claim 8 wherein a substantially single crystalline character of the substantially single crystalline mesoporous $Co_3O_4$ material is measured as a selected area electron diffraction spectrum of the substantially single crystalline mesoporous $Co_3O_4$ material having at least a 5×8 array of electron diffraction spots.

14. The battery electrode of claim 8 wherein the plurality of nanoparticles comprising the substantially single crystalline mesoporous $Co_3O_4$ material comprises from about 70 to about 90 weight percent of the battery electrode.

15. The battery electrode of claim 14 further comprising a conductivity agent that comprises from about 5 to about 15 weight percent of the battery electrode.

16. The battery electrode of claim 14 further comprising a binder agent that comprises from about 5 to about 15 weight percent of the battery electrode.

17. A battery comprising a battery electrode comprising a plurality of solid core nanoparticles comprising a substantially single crystalline mesoporous $Co_3O_4$ material characterized by at least a 5×7 array of selected area electron diffraction spots.

18. The battery of claim 17 wherein the battery comprises a lithium ion battery.

19. The battery of claim 17 wherein the battery electrode comprises a negative electrode.

20. The battery of claim 17 wherein the substantially single crystalline mesoporous $Co_3O_4$ material has a pore size from about 2 to about 20 nanometers.

21. The battery of claim 17 wherein the substantially single crystalline mesoporous $Co_3O_4$ material has a pore size from about 3 to about 8 nanometers.

22. The battery of claim 17 wherein the substantially single crystalline mesoporous $Co_3O_4$ material has a bimodal pore size distribution from about 2 to about 6 nanometers and from about 8 to about 18 nanometers.

23. The battery of claim 17 wherein a substantially single crystalline character of the substantially single crystalline mesoporous $Co_3O_4$ material is measured as a selected area electron diffraction spectrum of the substantially single crystalline mesoporous $Co_3O_4$ material having at least a 5×8 array of electron diffraction spots.

24. A method for preparing a $Co_3O_4$ nanoparticle comprising:
thermal annealing a first nanoparticle comprising a $Co(OH)_2$ material in an oxidizing atmosphere to provide a solid core second nanoparticle comprising a substantially single crystalline mesoporous $Co_3O_4$ material characterized by at least a 5×7 array of selected area electron diffraction spots.

25. The method of claim 24 wherein the first nanoparticle and the second nanoparticle have a needle shape, the needle shape having a length from about 2 to about 10 microns and a width from about 10 to about 500 nanometers.

26. The method of claim 24 wherein:
the thermal annealing is undertaken at a temperature from about 200 to about 400 degrees centigrade; and
the substantially single crystalline mesoporous $Co_3O_4$ material has a pore size from about 2 to about 20 nanometers.

27. The method of claim 24 wherein:
the thermal annealing is undertaken at a temperature from about 275 to about 325 degrees centigrade; and
the substantially single crystalline mesoporous $Co_3O_4$ material has a pore size from about 3 to about 8 nanometers.

28. The method of claim 24 wherein the oxidizing atmosphere is selected from the group consisting of air, oxygen and ozone oxidizing atmospheres.

29. The method of claim 24 wherein a substantial single crystal character of the substantially single crystalline mesoporous $Co_3O_4$ material is measured as a selected area electron diffraction spectrum of the substantially single crystalline mesoporous $Co_3O_4$ material having at least a 5×8 array of electron diffraction spots.

30. A method for preparing a $Co_3O_4$ nanoparticle comprising:
preparing a first nanoparticle comprising a $Co(OH)_2$ material; and
thermal annealing the first nanoparticle in an oxidizing atmosphere to form a solid core second nanoparticle comprising a substantially single crystalline mesoporous $Co_3O_4$ material characterized by at least a 5×7 array of selected area electron diffraction spots.

31. The method of claim 30 wherein the first nanoparticle and the second nanoparticle have a needle shape, the needle shape having a length from about 2 to about 10 microns and a width from about 10 to about 500 nanometers.

32. The method of claim 30 wherein:
the thermal annealing is undertaken at a temperature from about 200 to about 400 degrees centigrade; and
the substantially single crystalline mesoporous $Co_3O_4$ material has a pore size from about 2 to about 20 nanometers.

33. The method of claim 30 wherein:
the thermal annealing is undertaken at a temperature from about 275 to about 325 degrees centigrade; and
the substantially single crystalline mesoporous $Co_3O_4$ material has a pore size from about 3 to about 8 nanometers.

34. The method of claim 30 wherein the oxidizing atmosphere is selected from the group consisting of air, oxygen and ozone oxidizing atmospheres.

35. The method of claim 30 wherein a substantial single crystal character of the substantially single crystalline mesoporous $Co_3O_4$ material is measured as a selected area electron diffraction spectrum of the substantially single crystalline mesoporous $Co_3O_4$ material having at least a 5×8 array of electron diffraction spots.

36. The method of claim 30 wherein the preparing a first nanoparticle comprising the $Co(OH)_2$ material uses a Co II salt in an aqueous ammonia solution.

* * * * *